United States Patent
Chuang et al.

(10) Patent No.: US 10,032,828 B2
(45) Date of Patent: Jul. 24, 2018

(54) SEMICONDUCTOR MEMORY DEVICE AND METHOD FOR FABRICATING THE SAME

(71) Applicant: TAIWAN SEMICONDUCTOR MANUFACTURING COMPANY LTD., Hsinchu (TW)

(72) Inventors: Harry-Hak-Lay Chuang, Singapore (SG); Sheng-Haung Haung, Hsinchu (TW); Shih-Chang Liu, Kaohsiung County (TW); Chern-Yow Hsu, Hsin-Chu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/200,481

(22) Filed: Jul. 1, 2016

(65) Prior Publication Data

US 2018/0006085 A1 Jan. 4, 2018

(51) Int. Cl.
*H01L 29/82* (2006.01)
*H01L 27/22* (2006.01)
*H01L 43/02* (2006.01)
*H01L 43/08* (2006.01)
*H01L 43/12* (2006.01)

(52) U.S. Cl.
CPC .......... *H01L 27/222* (2013.01); *H01L 43/02* (2013.01); *H01L 43/08* (2013.01); *H01L 43/12* (2013.01)

(58) Field of Classification Search
CPC . H01L 51/56; H01L 51/5246; H01L 51/5253; H01L 51/5072; H01L 27/3244
USPC .......................................................... 257/421
See application file for complete search history.

(56) References Cited

U.S. PATENT DOCUMENTS

| | | | |
|---|---|---|---|
| 7,473,646 B2 | 1/2009 | Shiraiwa et al. | |
| 8,138,562 B2 | 3/2012 | Mao | |
| 2004/0201929 A1 | 10/2004 | Hashimoto et al. | |
| 2005/0185454 A1 | 8/2005 | Brown et al. | |
| 2005/0260772 A1 | 11/2005 | Horng et al. | |
| 2007/0047153 A1 | 3/2007 | Zeltser | |
| 2007/0201265 A1 | 8/2007 | Ranjan et al. | |
| 2007/0228511 A1* | 10/2007 | Matsuura ......... | H01L 27/11502 257/528 |
| 2008/0186758 A1 | 8/2008 | Shen et al. | |
| 2008/0291584 A1 | 11/2008 | Parkin | |
| 2009/0173977 A1 | 7/2009 | Xiao et al. | |
| 2009/0273087 A1 | 11/2009 | French et al. | |
| 2010/0007344 A1 | 1/2010 | Guo et al. | |
| 2010/0148167 A1 | 6/2010 | Whig et al. | |
| 2010/0219491 A1 | 9/2010 | Lee et al. | |
| 2011/0032644 A1 | 2/2011 | Watts et al. | |
| 2011/0089507 A1 | 4/2011 | Mao | |

(Continued)

FOREIGN PATENT DOCUMENTS

WO WO2005022622 3/2005
WO WO2011049623 4/2011

*Primary Examiner* — Andy Huynh
(74) *Attorney, Agent, or Firm* — Haynes and Boone, LLP

(57) ABSTRACT

A method for fabricating a semiconductor memory device is provided. The method includes: etching a first region of the semiconductor memory device to expose a first capping layer; forming a second capping layer on the first capping layer; etching a portion of the first capping layer and a portion of the second capping layer to form a first trench reaching a first metal line; and forming a second metal line in the first trench to contact the first metal line.

19 Claims, 19 Drawing Sheets

(56) References Cited

U.S. PATENT DOCUMENTS

| | | |
|---|---|---|
| 2011/0233699 A1* | 9/2011 | Takenaga ............ H01L 27/0207 |
| | | 257/421 |
| 2011/0316103 A1 | 12/2011 | Uchida et al. |
| 2012/0032287 A1 | 2/2012 | Li et al. |
| 2015/0171314 A1 | 6/2015 | Li et al. |
| 2016/0133560 A1* | 5/2016 | Landgraf ............ H01L 23/5223 |
| | | 257/532 |
| 2017/0092693 A1* | 3/2017 | Tan ...................... H01L 27/228 |

* cited by examiner

SEMICONDUCTOR MEMORY DEVICE AND METHOD FOR FABRICATING THE SAME

BACKGROUND

Semiconductors are used in integrated circuits for electronic applications, including radios, televisions, cell phones, and personal computing devices. One type of well-known semiconductor devices is the semiconductor storage device, such as dynamic random access memories (DRAMs), or flash memories, both of which use charges to store information.

A more recent development in semiconductor memory devices involves spin electronics, which combines semiconductor technology and magnetic materials and devices. The spin polarization of electrons, rather than the charge of the electrons, is used to indicate the state of "1" or "0." One such spin electronic device is a spin torque transfer (STT) magnetic tunneling junction (MTJ) device.

An MTJ device includes a free layer, a tunnel layer, and a pinned layer. The magnetization direction of the free layer can be reversed by applying a current through the tunnel layer, which causes injected polarized electrons within the free layer to exert so-called spin torques on the magnetization of the free layer. The pinned layer has a fixed magnetization direction. When current flows in the direction from the free layer to the pinned layer, electrons flow in a reverse direction, that is, from the pinned layer to the free layer. The electrons are polarized to the same magnetization direction of the pinned layer after passing the pinned layer, flow through the tunnel layer and then into and accumulate in the free layer. Eventually, the magnetization of the free layer is parallel to that of the pinned layer, and the MTJ device will be at a low resistance state. Such electron injection caused by current is referred to as a major injection.

When current flowing from the pinned layer to the free layer is applied, electrons flow in the direction from the free layer to the pinned layer. Electrons having the same polarization as the magnetization direction of the pinned layer are able to flow through the tunnel layer and into the pinned layer. Conversely, electrons with polarization different from the magnetization of the pinned layer are reflected (blocked) by the pinned layer and accumulate in the free layer. Eventually, the magnetization of the free layer becomes anti-parallel to that of the pinned layer, and the MTJ device will be at a high resistance state. Such electron injection caused by current is referred to as a minor injection.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
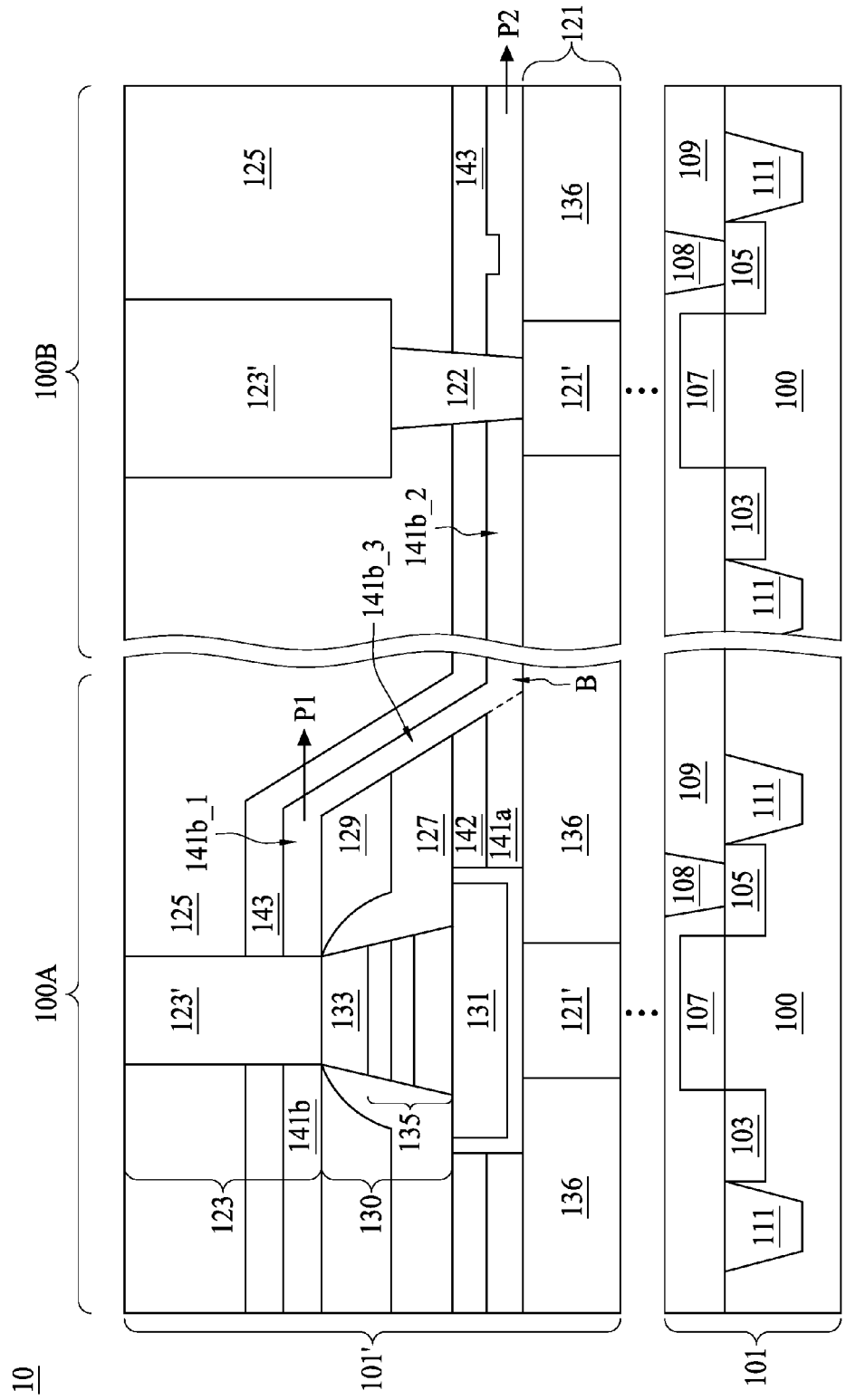
FIG. 1 is a cross-sectional view of a semiconductor memory device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "lower," "above," "upper", "lower", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Embedded MRAM cell in a CMOS structure has been continuously developed. A semiconductor memory device with embedded MRAM cells includes an MRAM cell region and a logic region. The MRAM cell region may comprise a plurality of MRAM cells. The logic region may comprise a plurality of conductive lines or metal lines. The plurality of conductive lines may be the routing of the plurality of MRAM cells. The logic region and the MRAM cell region may be disposed in different regions in the semiconductor memory device. For example, the MRAM cell region may be located at the center of the semiconductor memory device while the logic region may be located at a periphery of the semiconductor memory device. However, such an example is not intended to be limiting. Other arrangements of the MRAM cell region and the logic region fall within the contemplated scope of the present disclosure.

In the MRAM cell region, a transistor structure may be disposed under an MRAM structure. In some embodiments, an MRAM cell is embedded in a metallization layer prepared in a back-end-of-line (BEOL) operation. In some embodiments, transistor structures in the MRAM cell region and the logic region are disposed in a same semiconductor substrate and prepared in a front-end-of-line operation, and thus are substantially identical. The MRAM cell can be embedded in any position of the metallization layer, for example, between adjacent metal line layers extending in parallel over the semiconductor substrate. For instance, the embedded MRAM cell can be located between a $4^{th}$ metal line layer and a $5^{th}$ metal line layer in the MRAM cell region. In the logic region, the $4^{th}$ metal line layer is connected to the $5^{th}$ metal line layer though a $4^{th}$ metal via, which is located between the $4^{th}$ metal line layer and the 5th metal line layer. In other words, taking the MRAM cell region and the logic region into consideration, an embedded MRAM cell has a thickness of at least a portion of the 5th metal line layer and the $4^{th}$ metal via. The number provided for the metal line layer herein is exemplary and not limiting. In general, people having ordinary skill in the art can understand that the MRAM cell is located between an $N^{th}$ metal line layer and an $(N+1)^{th}$ metal line layer, where N is an integer greater than or equal to 1.

The embedded MRAM cell includes a magnetoresitive cell. In some embodiments, the magnetoresitive cell is a magnetic tunneling junction (MTJ) composed of ferromagnetic materials. The MTJ may further comprise a bottom electrode and a top electrode. The bottom electrode and the top electrode are electrically coupled to the MTJ for signal/bias conveyance. Following the example previously provided, the bottom electrode is further connected to the $N^{th}$ metal line layer, whereas the top electrode is further connected to the $(N+1)^{th}$ metal line layer. When a bias is applied across a combined structure of the $(N+1)^{th}$ metal line layer, the top electrode, the MTJ, the bottom electrode and the $N^{th}$ metal line layer, one can obtain a series resistance $R_s$ of the combined structure when a current flowing therethrough is measured. The series resistance $R_s$ in an MRAM cell shall be reduced to or kept at a desirable value as low as possible.

There is, however, a large series resistance $R_s$ to be expected due to non-conductive layers in the aforesaid combined structure. For example, an oxide layer may exist between the top electrode and the $(N+1)^{th}$ metal line layer. The formation of the oxide layer may be due to a fast oxidation rate of a conventional material adopted for the top electrode. The top electrode may be a capping layer on the MTJ. The capping layer may include non-ferromagnet metal or insulator. Such materials include, but are not limited to, silver (Ag), gold (Au), copper (Cu), tantalum (Ta), tantalum nitride (TaN), tungsten (W), manganese (Mn), platinum (Pt), palladium (Pd), vanadium (V), chromium (Cr), niobium (Nb), molybdenum (Mo), technetium (Tc), ruthenium (Ru), iridium (Ir), rhenium (Re), osmium (Os), aluminum oxide (Al2O3), magnesium oxide (MgO), tantalum oxide (TaO), ruthenium oxide (RuO) or a combination thereof. In some embodiments, Ta is widely used for the top electrode because the selectivity between such material (Ta) and a hard mask is relatively high. A post-deposition bombarding operation may be adopted to remove the oxide layer and reduce the series resistance $R_s$. However, due to the concurrent fabrication of the MRAM cell region and the logic region, the post-deposition bombarding operation may be effective for removing the oxide layer in the MRAM cell region, yet can be detrimental to the uncovered metal line layers of the logic region. Therefore, post-deposition bombarding may not be an effective solution to remove the oxide layer.

The present disclosure provides a method for fabricating a semiconductor memory device that produces very little or no oxide layer as a by-product in the top electrode of an MTJ. As a result, no post-deposition bombarding operation is required to remove the oxide layer in order to reduce the series resistance $R_s$ of the MTJ.

FIG. 1 is a cross-sectional view of a semiconductor memory device 10, in accordance with some embodiments of the present disclosure. Referring to FIG. 1, the semiconductor memory device 10 includes a first region 100A and a second region 100B. The first region may include an MRAM cell region and the second region may include a logic region. Each of the MRAM cell region 100A and the logic region 100B has a transistor structure 101 in a semiconductor substrate 100. In some embodiments, the transistor structures 101 are substantially identical in the MRAM cell region 100A and in the logic region 100B. In some embodiments, the semiconductor substrate 100 may include but is not limited to, for example, a silicon substrate. In the case of silicon substrate, the semiconductor substrate 100 may further include other semiconductor materials, such as silicon germanium, silicon carbide or gallium arsenide. In the present embodiment, the semiconductor substrate 100 is a p-type semiconductor substrate (P-Substrate) or an n-type semiconductor substrate (N-Substrate) comprising silicon. Alternatively, the semiconductor substrate 100 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the semiconductor substrate 100 is a semiconductor on insulator (SOI). In other alternatives, semiconductor substrate 100 may include a doped epi layer, a gradient semiconductor layer, and/or a semiconductor layer overlying another semiconductor layer of a different type, such as a silicon layer on a silicon germanium layer.

The semiconductor substrate 100 further includes heavily doped regions such as sources 103 and drains 105 at least partially in the semiconductor substrate 100. A gate 107 is positioned over a top surface of the semiconductor substrate 100 between the source 103 and the drain 105. Contact plugs 108 are formed in an inter-layer dielectric (ILD) 109, and may be electrically coupled to the transistor structure 101. In some embodiments, the ILD 109 is formed on the semiconductor substrate 100. The ILD 109 may be formed by a variety of techniques for forming such layers, e.g., chemical vapor deposition (CVD), low-pressure CVD (LPCVD), plasma-enhanced CVD (PECVD), sputtering and physical vapor deposition (PVD), thermal growing, and the like. Suitable materials for the ILD 109 may include, for example, oxide (e.g., Ge oxide), oxynitride (e.g., GaP oxynitride), silicon dioxide ($SiO_2$), nitrogen-bearing oxide (e.g., nitrogen-bearing $SiO_2$), nitrogen-doped oxide (e.g., $N_2$-implanted $SiO_2$), silicon oxynitride ($Si_xO_yN_z$), or a combination thereof.

While FIG. 1 shows a planar transistor having a doped region in the semiconductor substrate 100, the present disclosure is not limited thereto. Any non-planar transistor, such as a FinFET structure, can have raised doped regions.

In some embodiments, a shallow trench isolation (STI) 111 is provided to define and electrically isolate adjacent transistors. A number of STIs 111 are formed in the semiconductor substrate 100. The STI 111, which may be formed of suitable dielectric materials, may be provided to isolate a transistor electrically from neighboring semiconductor devices such as other transistors. The STI 111 may, for example, include an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), or a combination thereof. The STI 111 may also be formed of any suitable "high dielectric constant" or "high K" material, where K is greater than or equal to about 8, such as titanium oxide ($Ti_xO_y$, e.g., $TiO_2$), tantalum oxide ($Ta_xO_y$, e.g., $Ta_2O_5$), and barium strontium titanate (BST, $BaTiO_3$/$SrTiO_3$). Alternatively, the STI 111 may also be formed of any suitable "low dielectric constant" or "low K" dielectric material, where K is less than or equal to about 4.

Referring to FIG. 1, a metallization structure 101' including an $N^{th}$ metal layer 121 is disposed above the transistor structure 101. Because the $N^{th}$ metal layer 121 may not be the first metal layer over the transistor structure 101, for illustration, an intermediate portion between the metallization structure 101' and the transistor structure 101 is omitted. In the MRAM cell region 100A, a plurality of MTJ structures are disposed between an $N^{th}$ metal line 121' of the $N^{th}$ metal layer 121 and an $(N+1)^{th}$ metal line 123' of an $(N+1)^{th}$ metal layer 123. For brevity, only an exemplary MTJ structure 130 is illustrated. In the logic region 100B, the conductive lines are also simplified for the purpose of description. In the logic region 100B, the $N^{th}$ metal line 121' is connected to the $(N+1)^{th}$ metal line 123' by an $N^{th}$ metal via 122 of the $N^{th}$ metal layer 121. In some embodiments, the metal lines and metal vias are filled with electrically conductive material, such as copper, gold or another suitable metal or alloy. Metal lines and metal vias in different metal layers form an interconnect structure composed of substantially pure copper (for example, with a weight percentage of copper being greater than about 90 percent, or greater than about 95 percent) or copper alloys, and may be formed using the single and/or dual damascene processes. Metal lines and metal vias may be, or may not be, substantially free from aluminum. Interconnect structure includes a plurality of metal layers, namely $M_1$, $M_2$ . . . $M_N$. Throughout the description, the term "metal layer" refers to a patterned conductive layer where metal lines are formed. Metal layers $M_1$ through $M_N$ are separated by inter-metal dielectrics (IMDs) 125, which may include oxides such as un-doped Silicate Glass (USG), Fluorinated Silicate Glass (FSG), low-k dielectric materials, or the like. The low-k dielectric materials may have k values lower than 3.8, even though the dielectric materials of IMDs 125 may also be close to 3.8. In some embodiments, the k values of the low-k dielectric materials are lower than about 3.0, and may be lower than about 2.5. The $N^{th}$ metal via 122 may be formed by a variety of techniques, e.g., electroplating, electroless plating, high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), or plasma-enhanced chemical vapor deposition (PECVD).

In the MRAM cell region 100A of the semiconductor structure 10, the MTJ structure 130 at least includes a bottom electrode 131, a top electrode 133, and an MTJ 135. In some embodiments, the bottom electrode 131 takes the form of a recess into a composite layer including a silicon carbide (SiC) layer 141a and a silicon-rich oxide (SRO) layer 142. The SiC layer 141a may be a capping layer for covering the $N^{th}$ metal line 121' during the fabrication process. The recess may include a quadrilateral recess or a trapezoidal recess. Alternatively, the SRO layer 142 can be replaced by or combined with tetraethyl orthosilicate (TEOS). In some embodiments, the bottom electrode 131 may include nitrides such as TiN, TaN, Ta, or Ru. In some embodiments, the top electrode 133 includes Ag, Au, Cu, Ta, TaN, W, Mn, Pt, Pd, V, Cr, Nb, Mo, Tc, Ru, Ir, Re, Os, Al2O3, MgO, TaO, RuO, or a combination thereof.

In the present embodiment as shown in the MRAM cell region 100A of FIG. 1, the $(N+1)^{th}$ metal line 123' is surrounded by an SiC layer 141b in addition to the IMDs 125, while the $(N+1)^{th}$ metal line 123' and the $N^{th}$ metal via 122 in the logic region 100B are surrounded by the IMDs 125 only. The SiC layer 141b may be a capping layer for covering the top electrode 133 during the fabrication. As shown in FIG. 1, a sidewall of the MTJ 135 is protected by a protection layer 127 such as a nitride layer. In some embodiments, the protection layer 127 includes silicon nitride (SiN). A thickness of the protection layer 127 may be about 250 Å (Angstrom). In some embodiments, a dielectric layer 129 can be disposed over the protection layer 127. The dielectric layer 129 may be a TEOS layer. In some embodiments, another TEOS layer 143 can be disposed over the SiC layer 141b, surrounding the $(N+1)^{th}$ metal line 123'. A thickness of the TEOS layer 143 may be about 150 Å.

In some embodiments, the bottom electrode 131 of the MTJ structure 130 is electrically coupled with the doped region. In some embodiments, the doped region is a drain 105 or a source 103. In other embodiments, the bottom electrode 131 of the MTJ structure 130 is electrically coupled with the gate 107. In some embodiments, the gate 107 of the semiconductor structure 10 includes a polysilicon gate or a metal gate.

In some embodiments, the SiC layer 141b extends from the MRAM cell region 100A to the logic region 100B. The SiC layer 141b and the SiC layer 141a are connected at a boundary B between the MRAM cell region 100A and the logic region 100B. For illustration purpose, the SiC layer 141b is divided into three portions. The first portion 141b_1 is in the MRAM cell region 100A, the second portion 141b_2 is in the logic region 100B, and the third portion 141b_3 connects the first portion 141b_1 and the second portion 141b_2. The third portion 141b_3 may include an inclined portion covering or conformal with the edges of the SRO 142, the protection layer 127, and the dielectric layer 129. The elevation of the first portion 141b_1 is at a position P1, and the elevation of the second portion 141b_2 is at a position P2. The position P1 is higher than the position P2. The elevation difference between the positions P1 and P2 is about the thickness of the MTJ structure 130.

The first portion 141b_1, the second portion 141b_2, and the third portion 141b_3 may have different thicknesses. The thickness of the first portion 141b_1 is greater than the thicknesses of either the second portion 141b_2 or the third portion 141b_3. The thickness of the third portion 141b_3 may be not uniform. In some embodiments, a thickness of the first portion 141*b*_1 may be greater than 100 Å or about 200 Å. A thickness of the second portion 141*b*_2 may be smaller than 200 Å. A thickness of the third portion 141*b*_3 may be about 200 Å. In addition, a thickness of the SiC layer 141*a* is about 100 Å.

In the MRAM cell region 100A, the (N+1)$^{th}$ metal line 123' passes through the IMDs 125, the TEOS layer 143, and the first portion 141*b*_1 of the SiC layer 141*b* in order for contacting the top electrode 133. Accordingly, the (N+1)$^{th}$ metal line 123' is embedded in the IMDs layer 125, the TEOS layer 143, and the first portion 141*b*_1 of the SiC layer 141*b*.

In the logic region 100B, the N$^{th}$ metal via 122 passes through the IMDs 125, the TEOS layer 143, and the second portion 141*b*_2 of the SiC layer 141*b* in order for contacting the N$^{th}$ metal line 121'. The (N+1)$^{th}$ metal line 123' contacts the N$^{th}$ metal via 122. Accordingly, the N$^{th}$ metal via 122 is embedded in the IMDs layer 125, the TEOS layer 143, and the second portion 141*b*_2 of the SiC layer 141*b*.

During the fabrication process of the MRAM cell region 100A, when the top electrode 133 of the MTJ structure 130 is formed, a SiC layer is immediately disposed over the top electrode 133 to prevent the oxidation of the top electrode 133. Therefore, the first portion 141*b*_1 of the SiC layer 141*b* may be the remnant portion of the SiC layer after the (N+1)$^{th}$ metal line 123' is formed.

During the fabrication process of the logic region 100B, when the dielectric layer 129, the dielectric layer 129, the protection layer 127, and the SRO 142 in the cell region 100A are etched, the N$^{th}$ metal line 121' may be exposed. This is because the SiC layer 141*a* disposed over the N$^{th}$ metal line 121' in the logic region 100B may also be etched. When the N$^{th}$ metal line 121' is exposed, the N$^{th}$ metal line 121' may deform during the subsequent fabrication processes. Then, another SiC layer is disposed over the N$^{th}$ metal line 121' to recap or repair the SiC layer 141*a* for preventing the exposure of the N$^{th}$ metal line 121'. Therefore, the second portion 141*b*_2 of the SiC layer 141*b* may be the remnant portion of the another SiC layer after the N$^{th}$ metal via 122' is formed.

Figure 2:
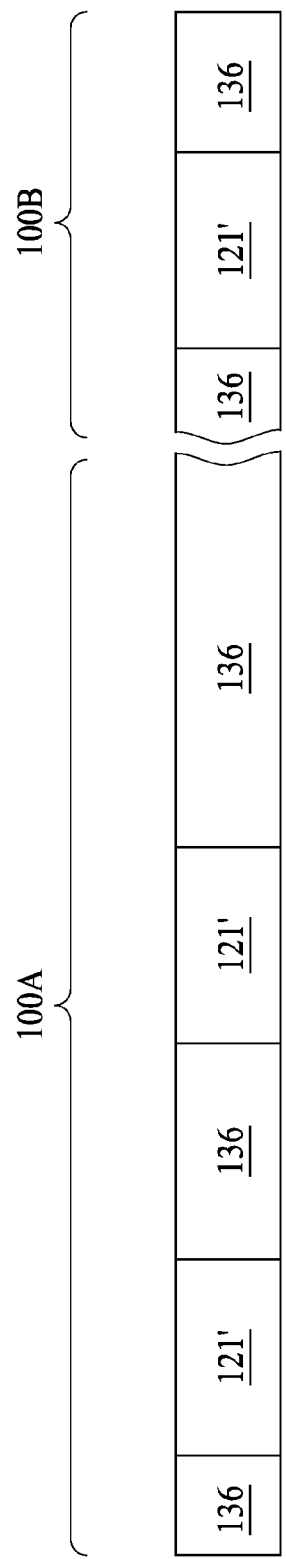
FIG. 2 to FIG. 19 are cross-sectional views of a CMOS-MRAM structure fabricated at various stages, in accordance with some embodiments of the present disclosure.

The formation of the SiC layer 141*b* is described in more detail with reference to FIG. 2 to FIG. 19. FIG. 2 to FIG. 19 are cross-sectional views of a CMOS-MRAM structure fabricated at various stages, in accordance with some embodiments of the present disclosure. In FIG. 2, a semiconductor structure having a predetermined MRAM cell region 100A and a logic region 100B is provided. In some embodiments, a transistor structure is pre-formed in a semiconductor substrate (not shown in FIG. 2). The semiconductor structure may undergo further CMOS or MOS technology processing to form various features. For example, one or more contact plugs, such as silicide regions, may also be formed. The contact features may be coupled to the source and drain. The contact features comprise silicide materials, such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, or a combination thereof. In an example, the contact features are formed by a salicide (self-aligned silicide) process.

An N$^{th}$ metal line 121' is patterned in a dielectric layer 136 over the transistor structure. In some embodiments, the N$^{th}$ metal line 121' can be formed by an electroplating operation with a Cu seed layer deposited over the patterned dielectric layer 136. In other embodiments, the N$^{th}$ metal line 121' may be formed by a variety of techniques, e.g., electroless plating, high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), and plasma-enhanced chemical vapor deposition (PECVD). A planarization operation is performed to expose a top surface of the N$^{th}$ metal line 121' and the top surface of the dielectric layer 136.

Figure 3:
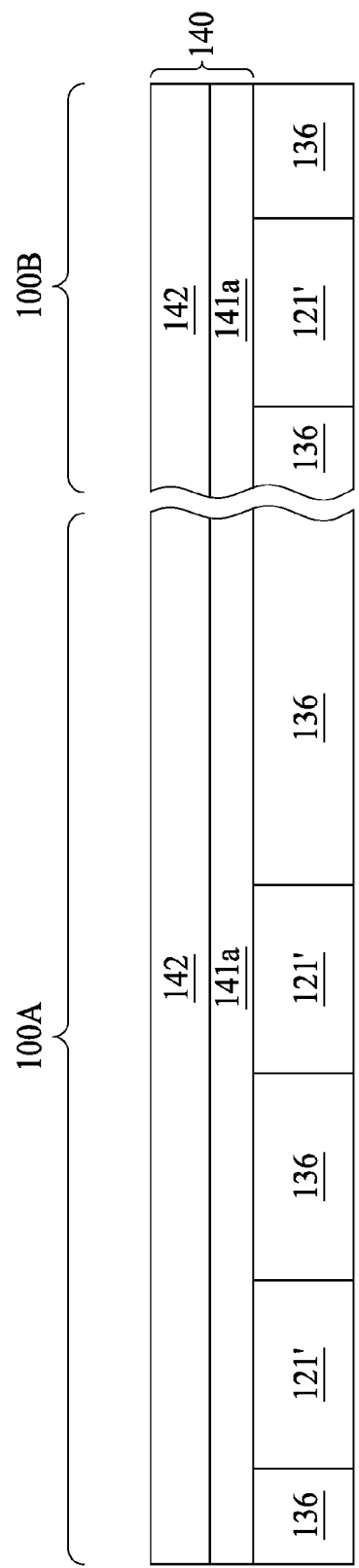

In FIG. 3, a barrier layer 140 in the form of a stacking layer including a SiC layer 141*a* and a TEOS/SRO layer 142 are blanket deposited over a top surface of the N$^{th}$ metal line 121' and a top surface of the dielectric layer 136, in both the MRAM cell region 100A and the logic region 100B. The barrier layer 140 can be formed by a variety of techniques, e.g., chemical vapor deposition (CVD), low-pressure CVD (LPCVD), plasma-enhanced CVD (PECVD), sputtering and physical vapor deposition (PVD), and thermal growing.

Figure 4:
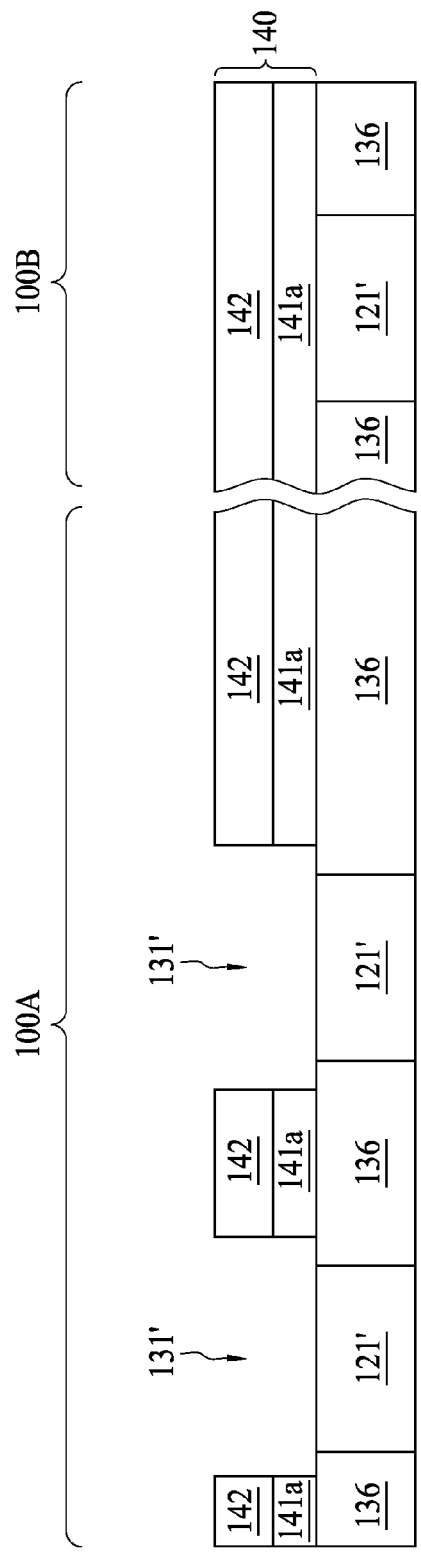

In FIG. 4, a photoresist layer (not shown) is patterned over the stacking layer to expose a bottom electrode region of the MTJ structure. As shown in FIG. 4, a bottom electrode via hole 131' is formed in the barrier layer 140 by a suitable dry etch operation. In some embodiments, the dry etch operation includes reactive ion etch (RIE) adopting fluorine-containing gases. In some embodiments, the dry etch operation includes a suitable dielectric etch to form via trenches in a metallization structure of conventional CMOS technology. Referring to the logic region 100B as shown in FIG. 4, the barrier layer 140 is protected by the photoresist layer (not shown) such that a top surface of the N$^{th}$ metal layer 121' is not exposed, as opposed to the counterpart in the MRAM cell region 100A.

Figure 5:
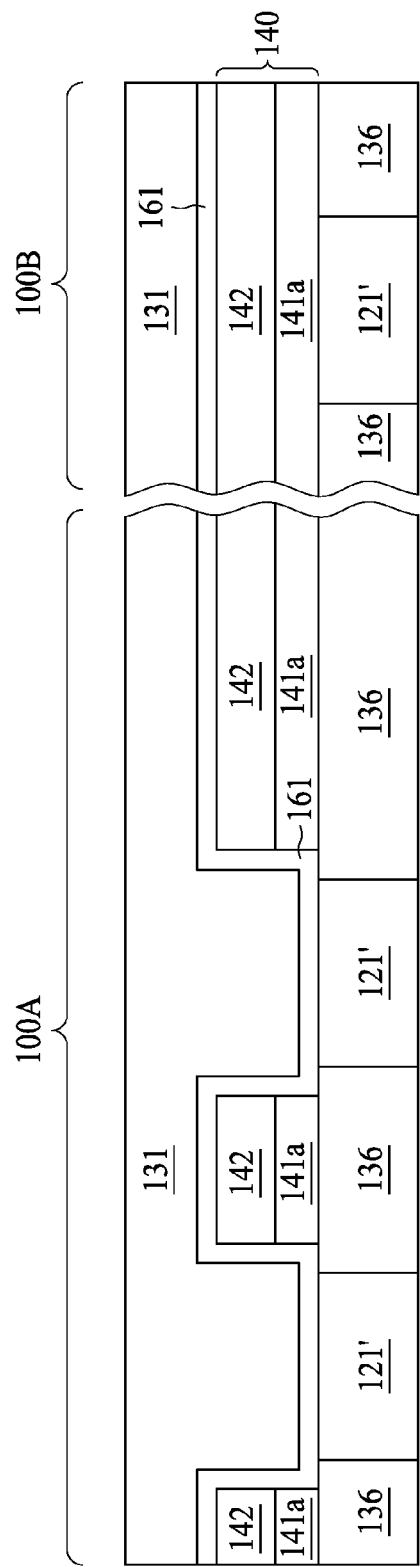
Figure 6:
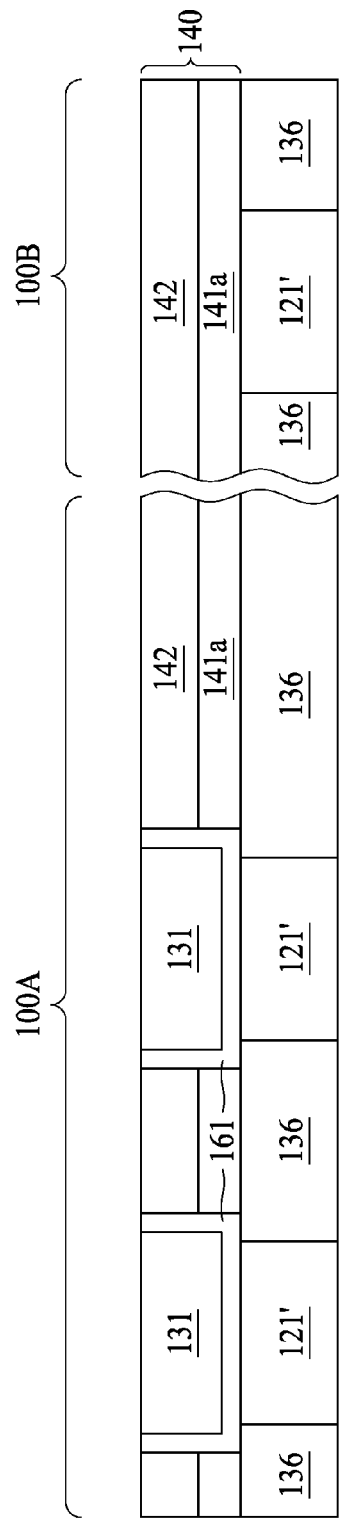

In FIG. 5, a diffusion barrier layer 161 is blanket lined over the bottom electrode via hole 131' in the MRAM cell region 100A and over the barrier layer 140 in the logic region 100B. Subsequently, a deposition of bottom electrode material 131 is conducted to be disposed over the diffusion barrier layer 161 and the barrier layer 140. The deposited bottom electrode material 131 may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), and plasma-enhanced chemical vapor deposition (PECVD). The diffusion barrier layer 161 and the deposited bottom electrode material 131 is then etched back to level with a top surface of the barrier layer 140, as illustrated in FIG. 6.

Figure 7:
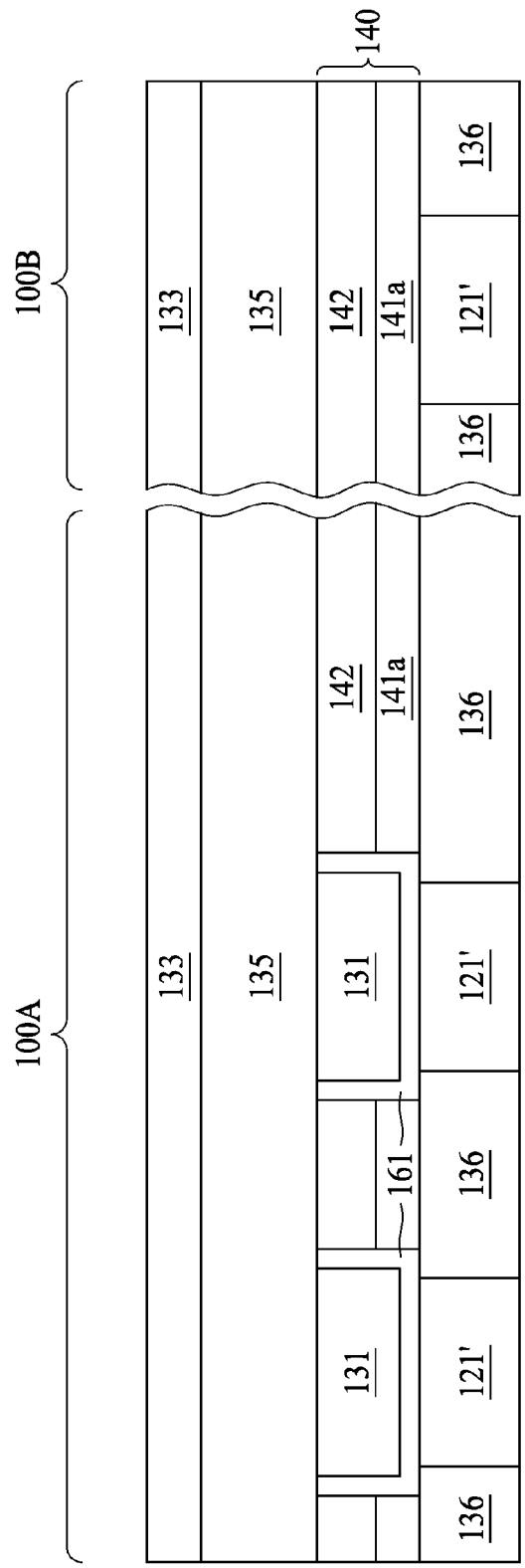

FIG. 7 shows the MTJ 135 and the top electrode formation of an MTJ structure. In FIG. 7, an MTJ 135 is deposited in the form of a stack of multiple materials over the bottom electrode 131. In some embodiments, the MTJ 135 has a thickness of from about 150 Å to about 250 Å. The MTJ 135 may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), and plasma-enhanced chemical vapor deposition (PECVD). In some embodiments, the MTJ 135 may include a free layer, a tunnel layer, and a pinned layer. The free layer may include a ferromagnetic material. The tunnel layer may be a first spacer layer composed of an insulator. The pinned layer may include two ferromagnetic layers and a second spacer layer. In the MTJ 135, the ferromagnetic material may include metal or a metal alloy, for example, Fe, Co, Ni, CoFeB, FeB, CoFe, FePt, FePd, CoPt, CoPd, CoNi, TbFeCo, and CrNi.

The first spacer may include an insulator, for example, $Al_2O_3$, MgO, TaO, and RuO. The second spacer may include non-ferromagnetic metal, for example, Ag, Au, Cu, Ta, W, Mn, Pt, Pd, V, Cr, Nb, Mo, Tc, and Ru. The free layer has a magnetic polarity or magnetic orientation that can be changed during a write operation of its associated MRAM cell. The pinned layer has a magnetic orientation that may not be changed during operation of its associated MRAM cell. It is contemplated that the MTJ 135 may include an antiferromagnetic layer in accordance with other embodiments. Following the formation of the MTJ 135, a top electrode layer 133 is deposited over the MTJ 135. The top electrode layer 133 may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), and plasma-enhanced chemical vapor deposition (PECVD). In some embodiments, the top electrode layer 133 is composed of TiN.

Figure 8:
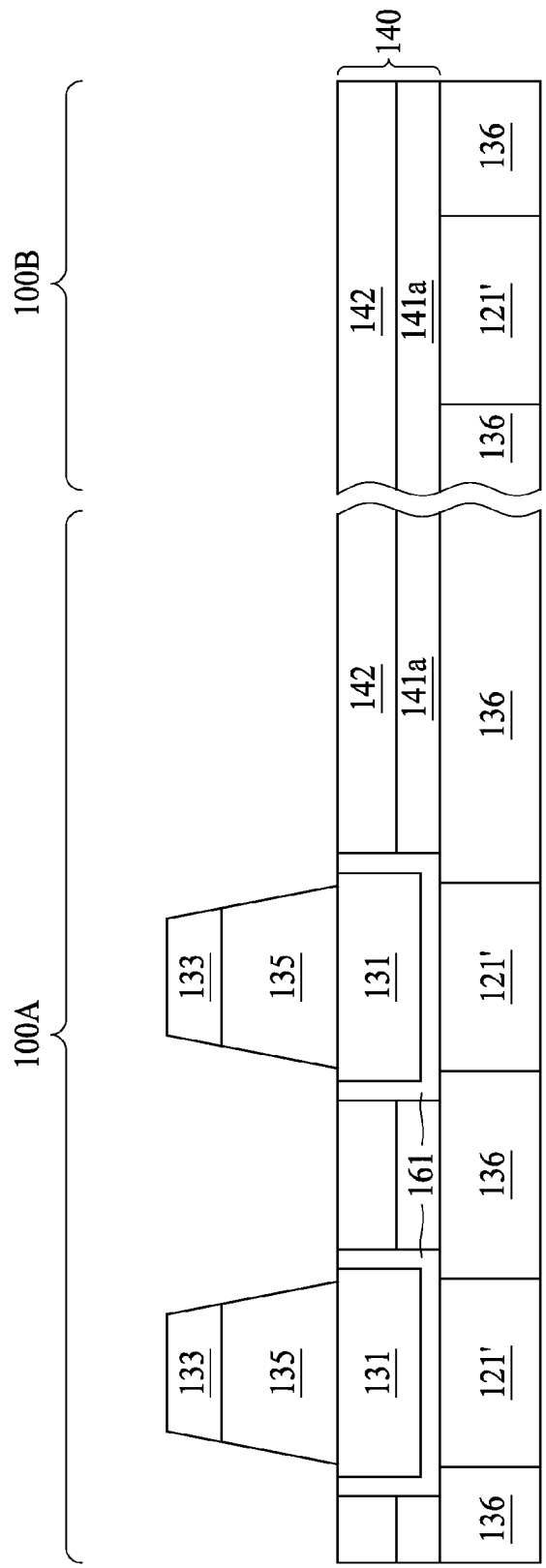

Referring to FIG. 8, a mask layer (not shown) is formed over the top electrode 133 for the ensuing MTJ structure formation. The mask layer may have a multi-layer structure, which may include, for example, an oxide layer, an advanced patterning film (APF) layer and an oxide layer. Each of the oxide layer, the APF layer, and the oxide layer may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), and plasma-enhanced chemical vapor deposition (PECVD). In some embodiments, the mask layer is configured to pattern the MTJ 135, the top electrode 133 and the bottom electrode 131. For example, a width of the masking region is determined according to the desired MTJ diameter. In some embodiments, the MTJ 135 and the top electrode 133 are formed by an RIE to achieve a trapezoidal shape in cross section.

Figure 9:
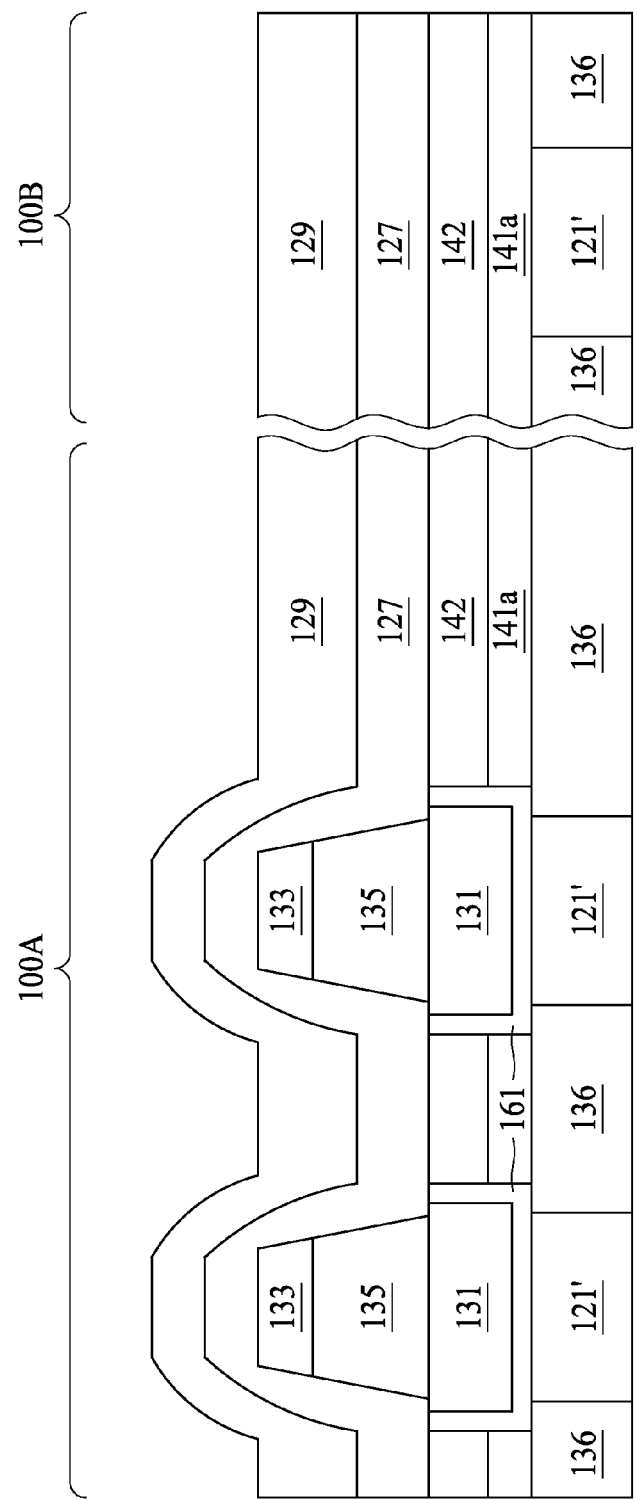

In FIG. 9, a protection layer 127 is conformally formed over the MTJ 135 and the top electrode 133. In some embodiments, the protection layer 127 has a thickness of from about 50 Å to about 300 Å. Note a sidewall of the MTJ 135 and the sidewall of the bottom electrode 131 are surrounded by the protection layer 127 to prevent oxidation or other contamination. Subsequently, a dielectric layer 129 such as a TEOS layer is conformally deposited over the protection layer 127. In some embodiments, a thickness of the dielectric layer 129 is to be determined according to an elevation of a top surface thereof relative to the top surface of the top electrode 133.

Figure 10:
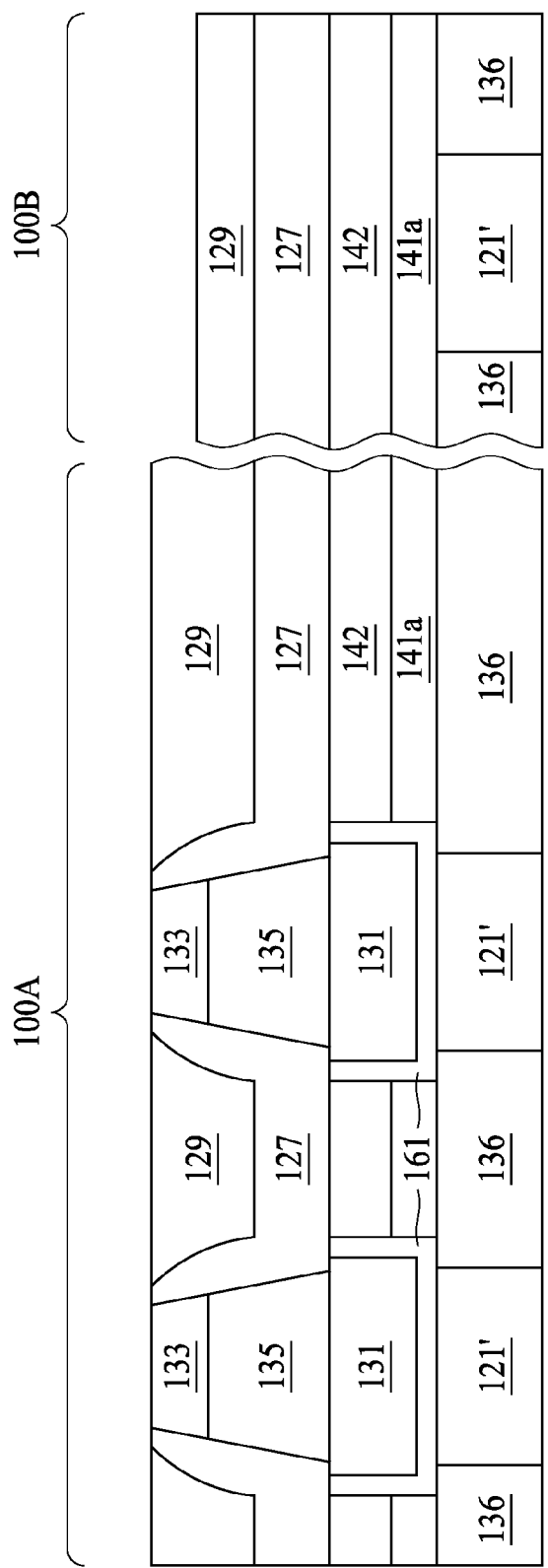
Figure 11:
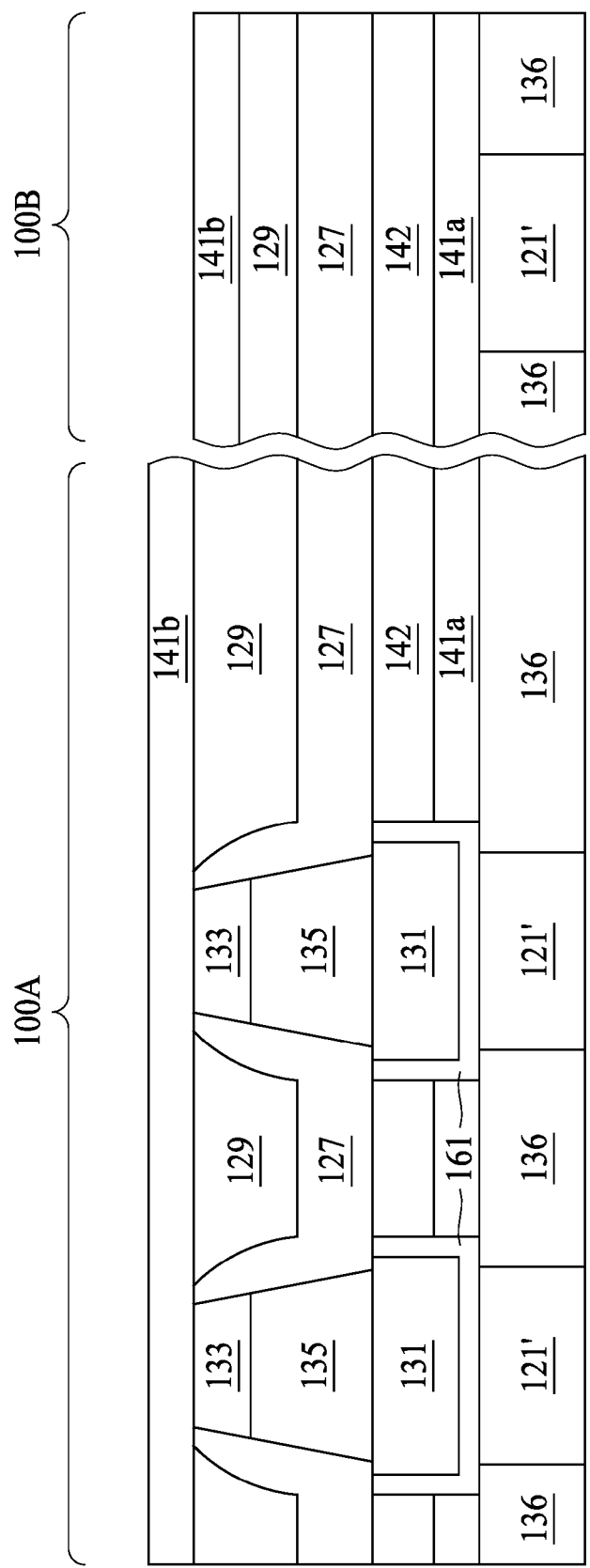

In FIG. 10, a planarization operation is performed on the dielectric layer 129 such that the top surface of the dielectric layer 129 is substantially flat across the MRAM cell region 100A. In some embodiments, after the planarization operation, the top surface of the dielectric layer 129 at the logic region 100B is lower than or substantially equal to the top surface of the dielectric layer 129 at the MRAM cell region 100A. As shown in FIG. 10, the top surface of the top electrode 133 is exposed from the dielectric layer 129 after the planarization operation. The planarization operation may be achieved by an etch back operation or a chemical mechanical polishing (CMP) operation on the dielectric layer 129.

When the top surface of the top electrode 133 of the MTJ structure 130 is exposed from a side (e.g. the dielectric layer 129) of the MTJ structure 130, a SiC layer 141b is immediately disposed over the side (i.e., the top surface of the top electrode 133) to protect the top electrode 133 from being oxidized. As previously discussed, the oxidation may increase the contact resistance of the top electrode 133 of the MTJ structure 130. Therefore, the formation of the SiC layer 141b is tantamount to a SiC recap operation to isolate the top surface of the top electrode 133. The thickness of the SiC layer 141b is from about 100 Å to about 300 Å. In some embodiments, the SiC layer 141b is disposed over the dielectric layer 129 of the MRAM cell region 100A and the logic region 100B. The SiC layer 141b can be formed by a variety of techniques, e.g., chemical vapor deposition (CVD), low-pressure CVD (LPCVD), plasma-enhanced CVD (PECVD), sputtering and physical vapor deposition (PVD), and thermal growing.

Figure 12:
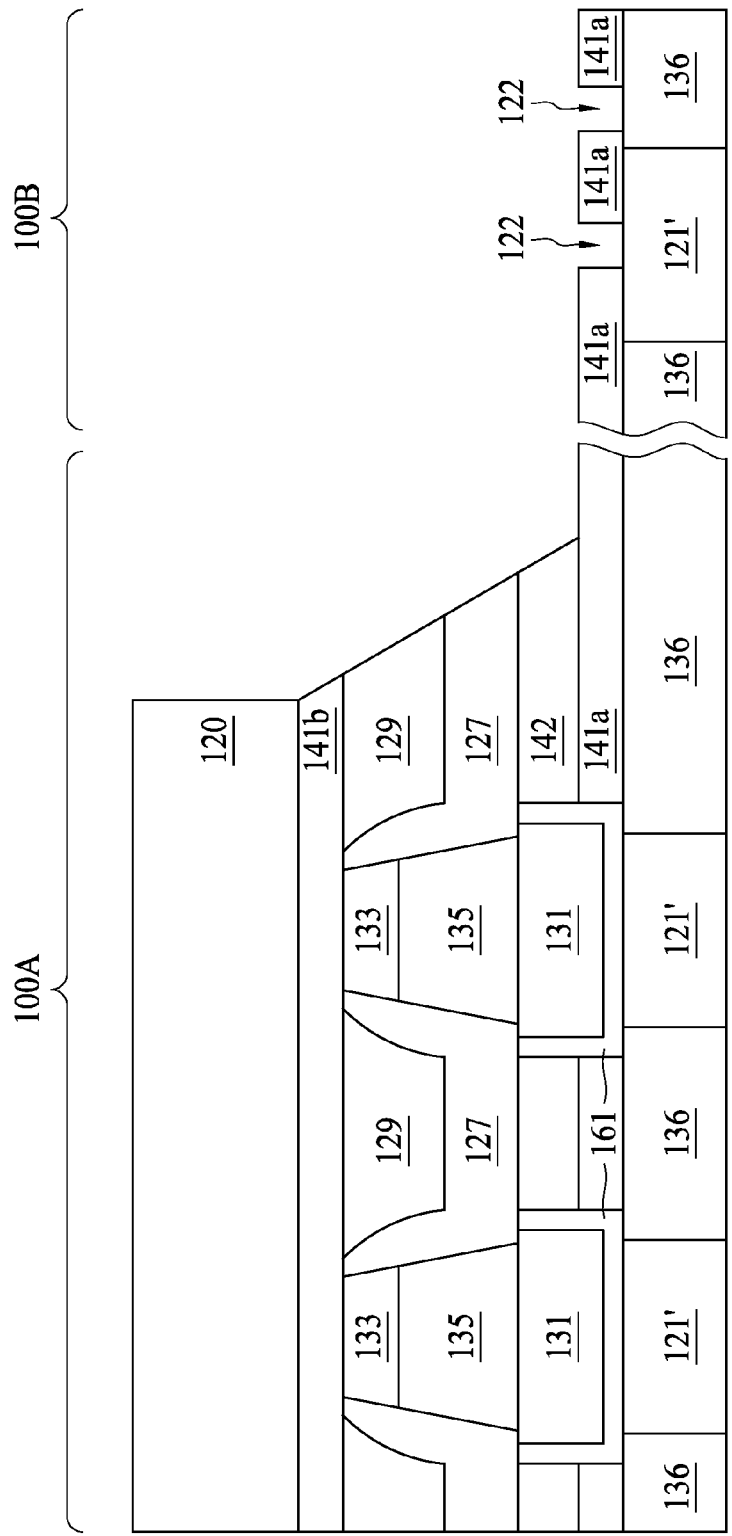

In FIG. 12, a photoresist layer 120 is patterned over the portion of the SiC layer 141b in the MRAM cell region 100A to expose a portion of the SiC layer 141b in the logic region 100B. Then, the portions of the SiC layer 141b, the dielectric layer 129, the protection layer 127, and the SRO 142 in the logic region 100B are etched by an etch back operation to form trenches for metal lines and metal vias in the logic region 100B. Hence, the MRAM cell region 100A is positioned at a higher elevation than the logic region 100B. In some situations, the etch back operation may damage or thin down the SiC layer 141a in the logic region 100B. Such damage causes a trench 122 into the $N^{th}$ metal line 121', exposing the $N^{th}$ metal line 121'. The exposed $N^{th}$ metal line 121' in the logic region 100B may extrude from the trench 122 and consequently deform under a relatively high temperature process. For example, as a result of the thermal process, the deformation may cause the material, e.g. Cu, of $N^{th}$ metal line 121' extruding the trench 122 and lead to short-circuiting between two different conductive lines in the logic region 100B.

Figure 13:
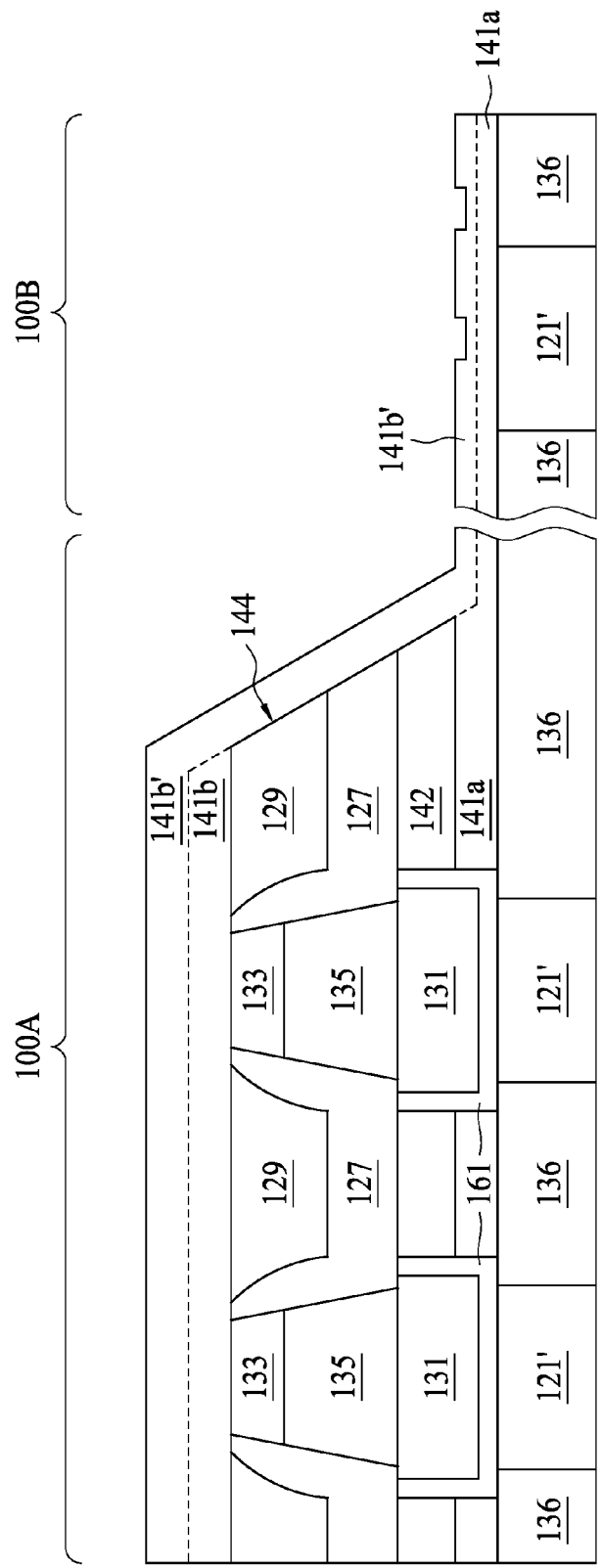

Then, in FIG. 13, another SiC layer 141b' is conformally disposed over the SiC layer 141b in the MRAM cell region 100A, the inclined portion 144, and the SiC layer 141a in the logic region 100B after the photoresist layer 120 is removed. The inclined portion 144 includes the edges of the SRO 142, the protection layer 127, and the dielectric layer 129. The SiC layer 141b' is to recap or repair the SiC layer 141a for preventing the exposure of the $N^{th}$ metal line 121'. The thickness of the SiC layer 141b' is from about 100 Å to about 300 Å. In some embodiments, the SiC layer 141b' can be formed by a variety of techniques, e.g., chemical vapor deposition (CVD), low-pressure CVD (LPCVD), plasma-enhanced CVD (PECVD), sputtering and physical vapor deposition (PVD), and thermal growing.

Figure 14:
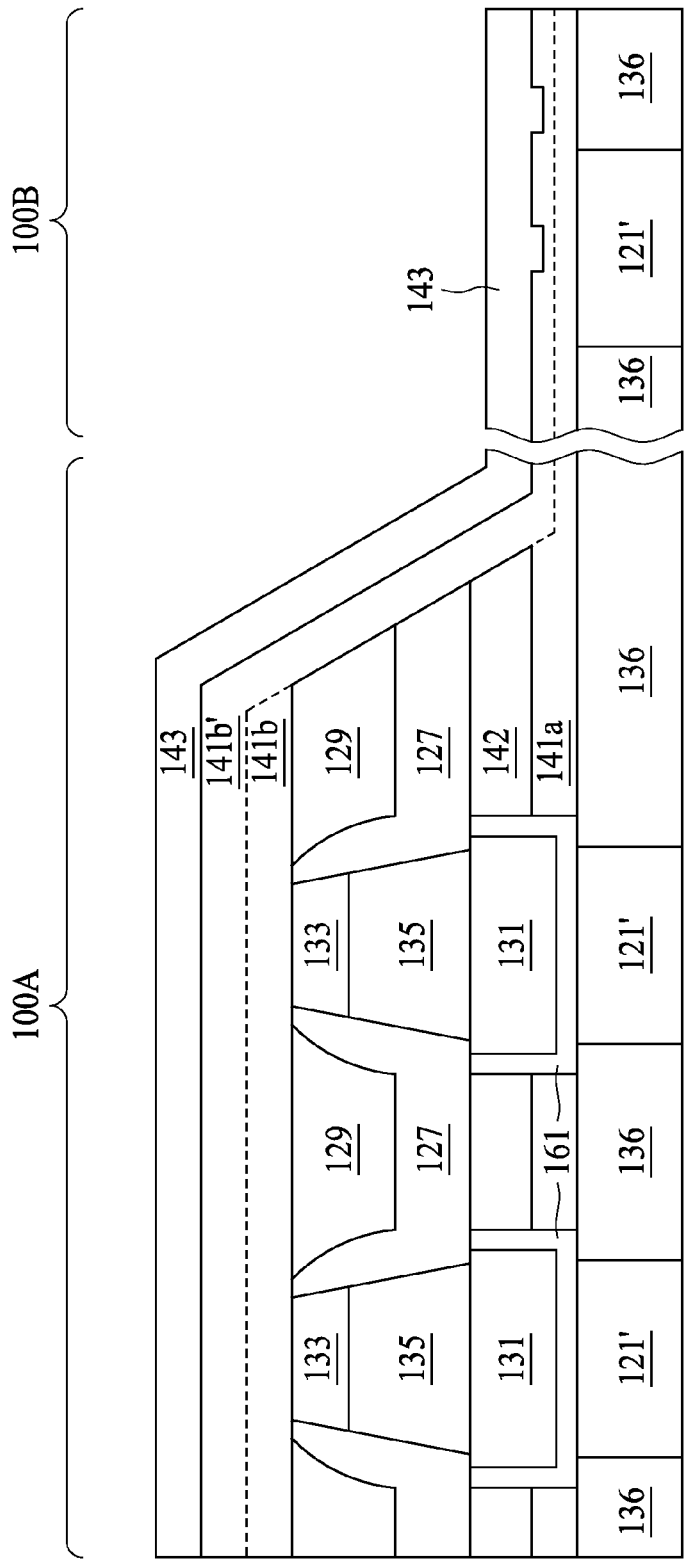

In FIG. 14, a TEOS layer 143 is deposited over the SiC layer 141b' in the MRAM cell region 100A and the logic region 100B. A thickness of the TEOS layer 143 may be about 150 Å.

Figure 15:
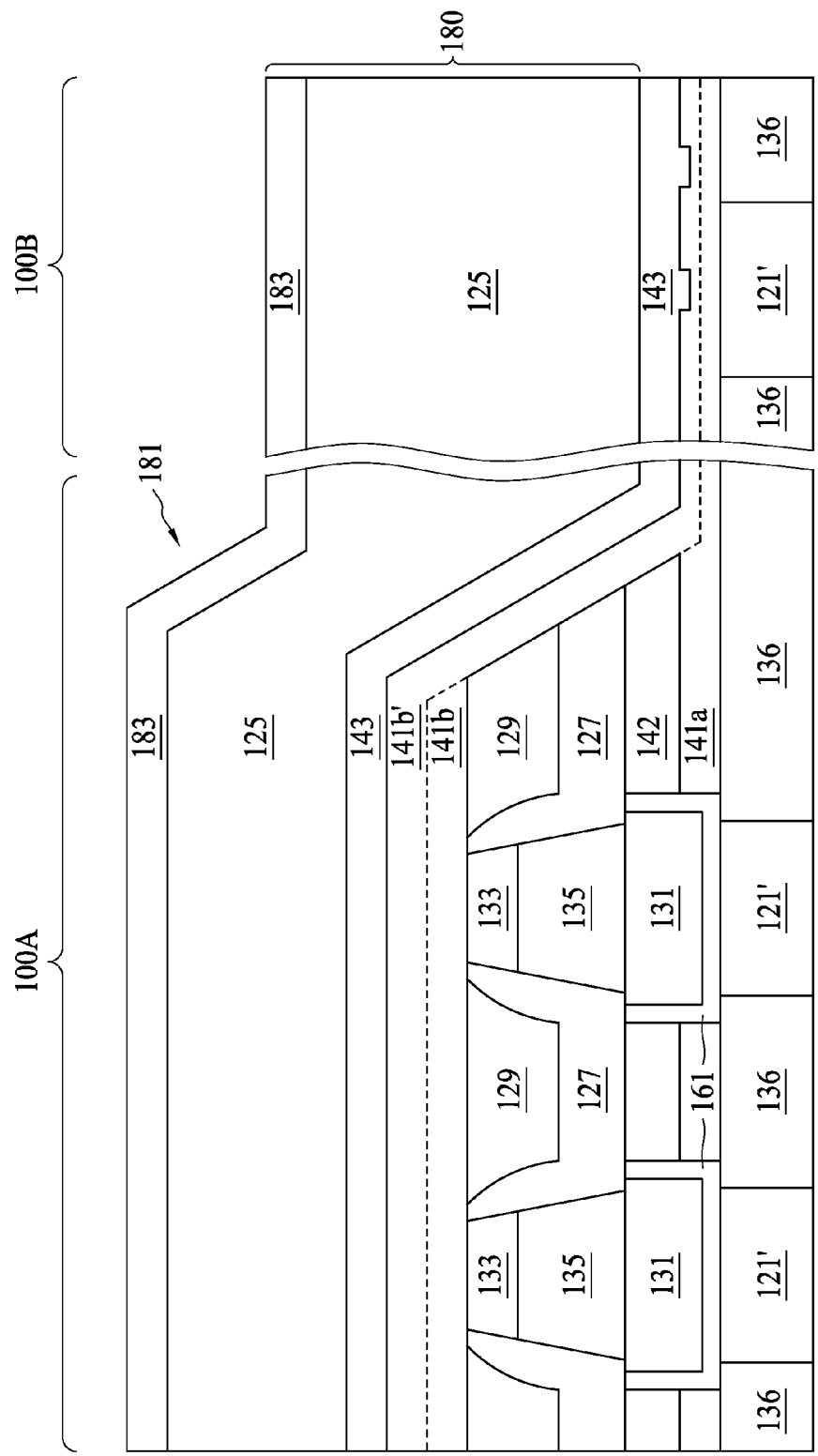
Figure 16:
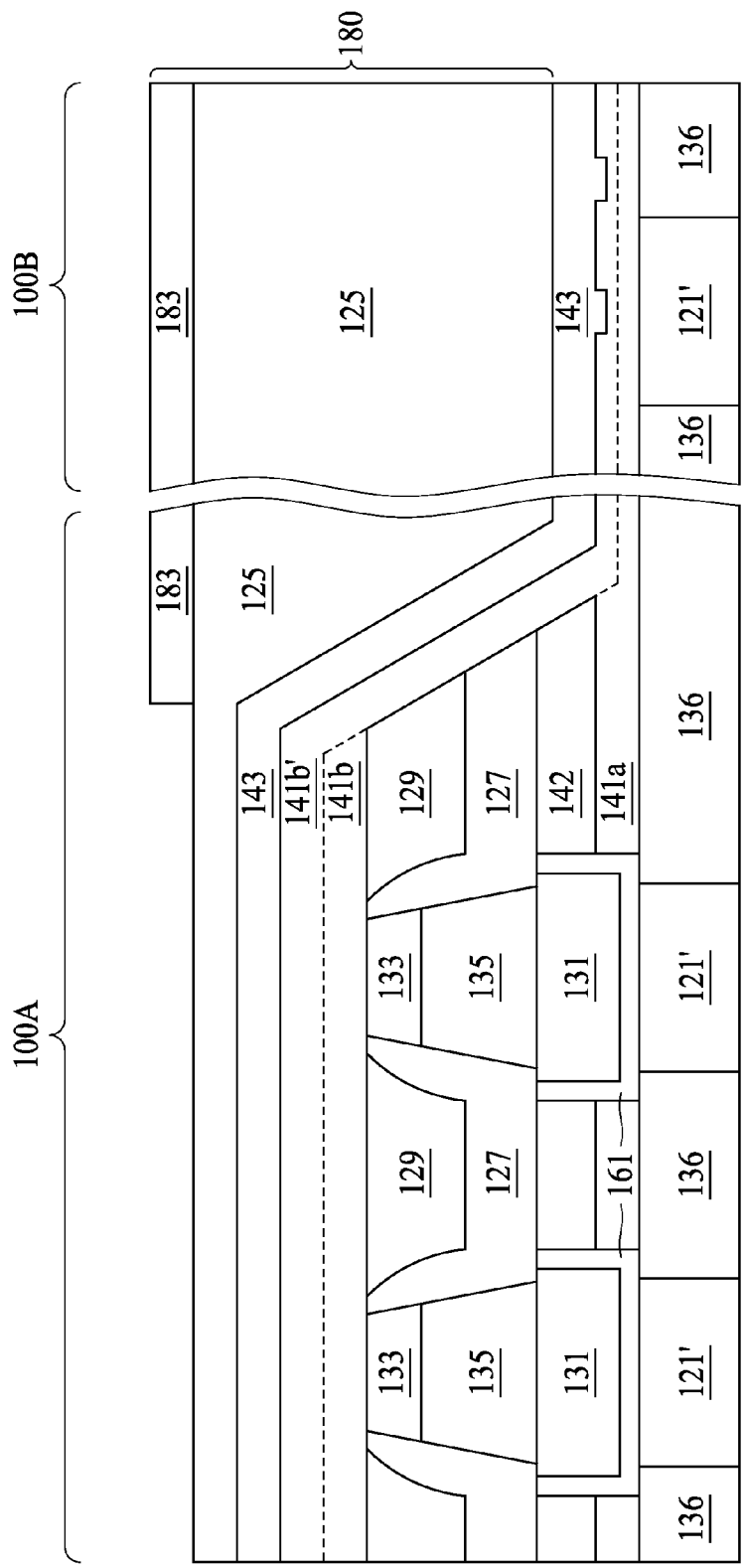

In FIG. 15, a dielectric composite structure 180, including a dielectric layer, a low-k dielectric layer and another dielectric layer, is formed to conformally cover the TEOS layer 143 in the MRAM cell region 100A and the logic region 100B. A step difference 181 can be observed in FIG. 15. Therefore, an etch back operation as illustrated in FIG. 16 is performed to obtain a substantially flat top surface for subsequent trench formation in both the MRAM cell region 100A and the logic region 100B. Note a dielectric layer 183 of the dielectric composite structure 180 is remained virtually in the logic region 100B after the aforesaid planarization operation. The dielectric layer 183 is deliberately kept to act as a protection layer for the subsequent trench formation.

The dielectric layer 183 can prevent the acidic solution from damaging the low k dielectric layer during a photoresist stripping operation.

Figure 17:
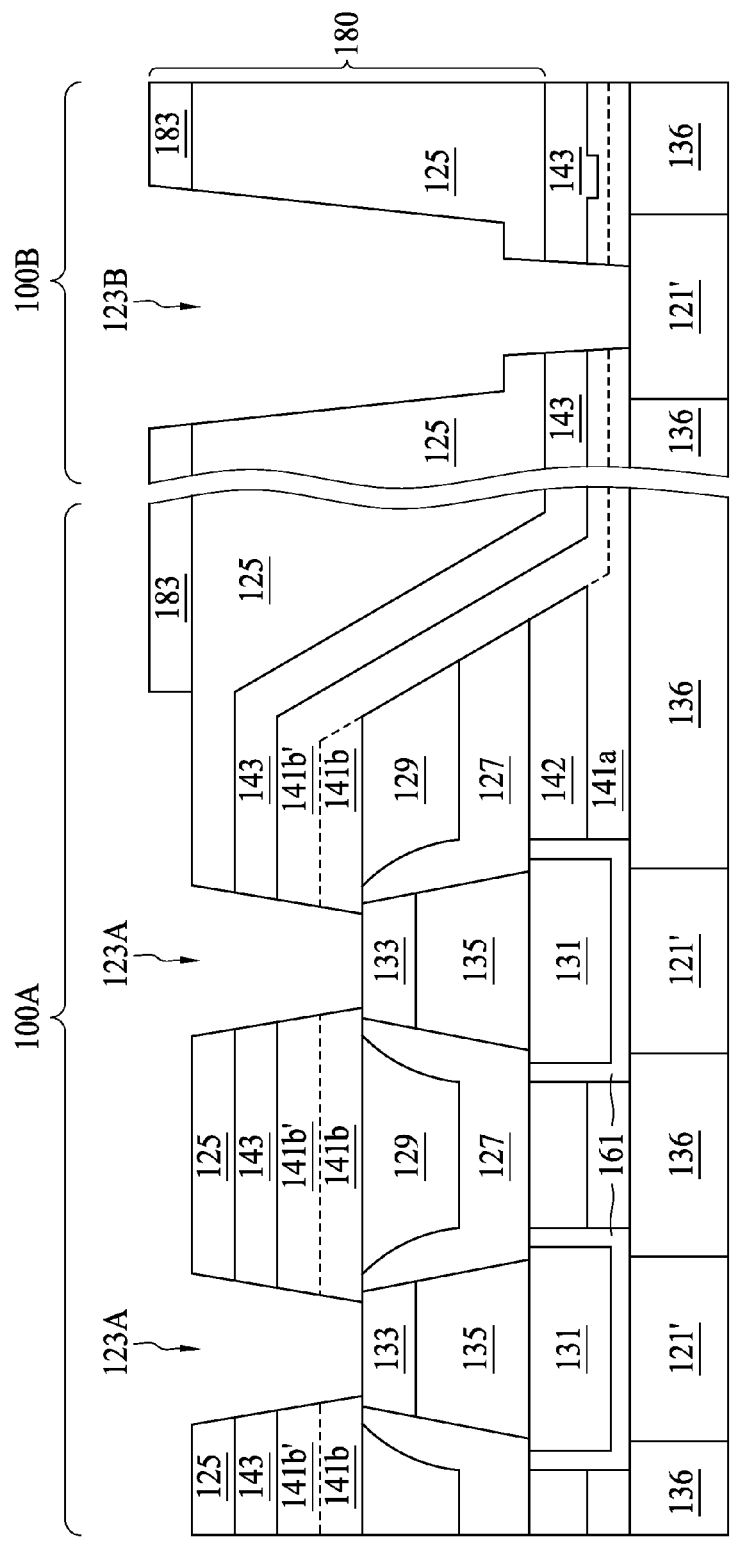

In FIG. 17, photoresist (not shown) is patterned over the planarized dielectric surface to form trenches for metal lines and metal vias. For example, in the MRAM cell region 100A, a (N+1)$^{th}$ metal line trench 123A is formed over the MTJ structure 130, exposing a top surface of the top electrode 133 of the MTJ structure 130. A portion of the IMDs 125, a portion of the TEOS layer 143, a portion of the SiC layer 141b', and a portion of the SiC layer 141b are etched to form the (N+1)$^{th}$ metal line trench 123A. Thus, the (N+1)$^{th}$ metal line trench 123A forms an opening passing through the IMDs 125, the TEOS layer 143, the SiC layer 141b', and the SiC layer 141b. In the logic region 100B, an N$^{th}$ metal via trench and an (N+1)$^{th}$ metal line trench (combinatory 123B) is formed over the N$^{th}$ metal line 121', exposing a top surface of the N$^{th}$ metal line 121'. A portion of the IMDs 125, a portion of the TEOS layer 143, a portion of the SiC layer 141b', and a portion of the SiC layer 141a are etched to form the trench 123B. Thus, the trench 123B forms an opening passing through the IMDs 125, the TEOS layer 143, the SiC layer 141b', and the SiC layer 141a.

Figure 18:
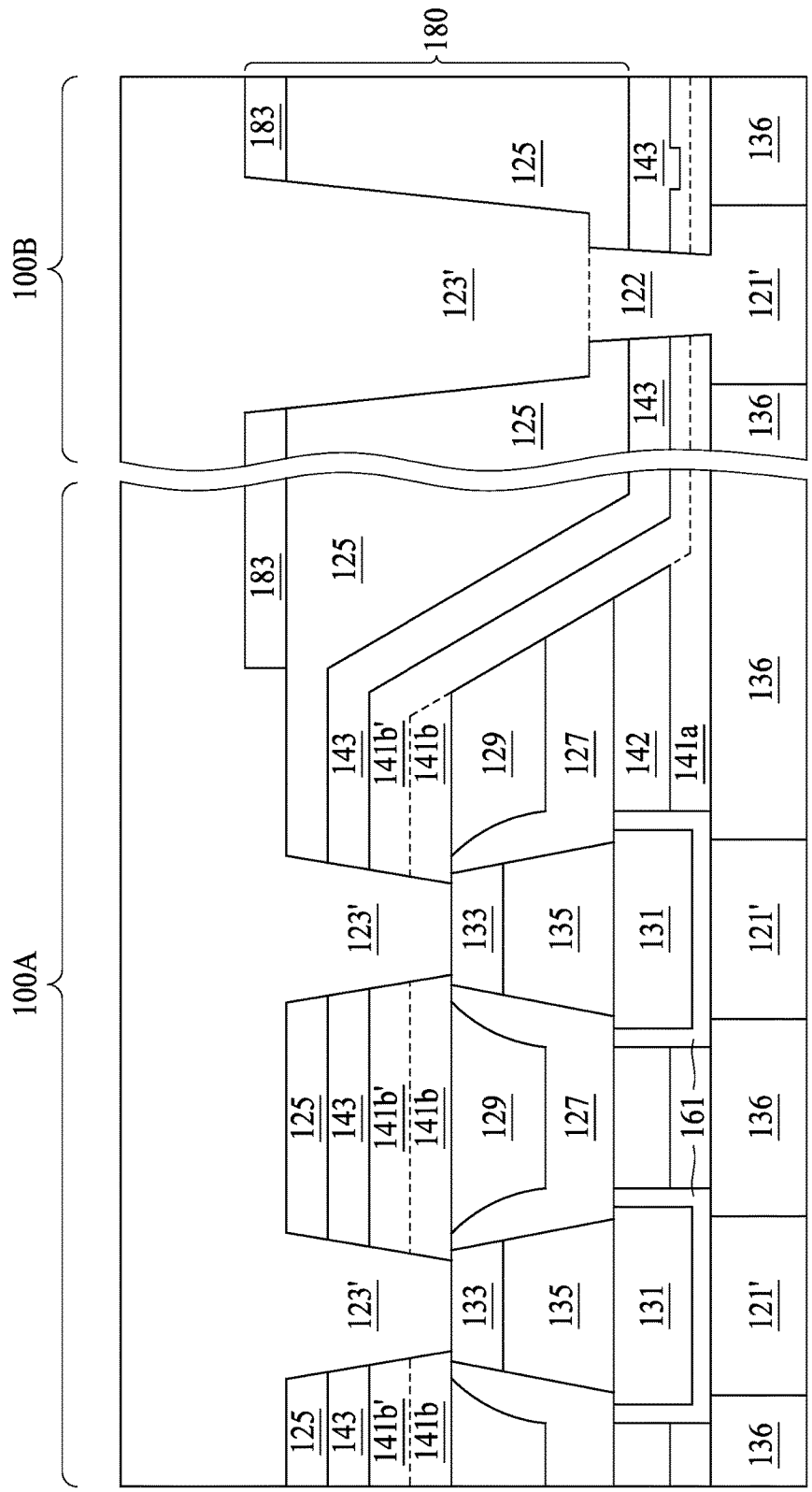
Figure 19:
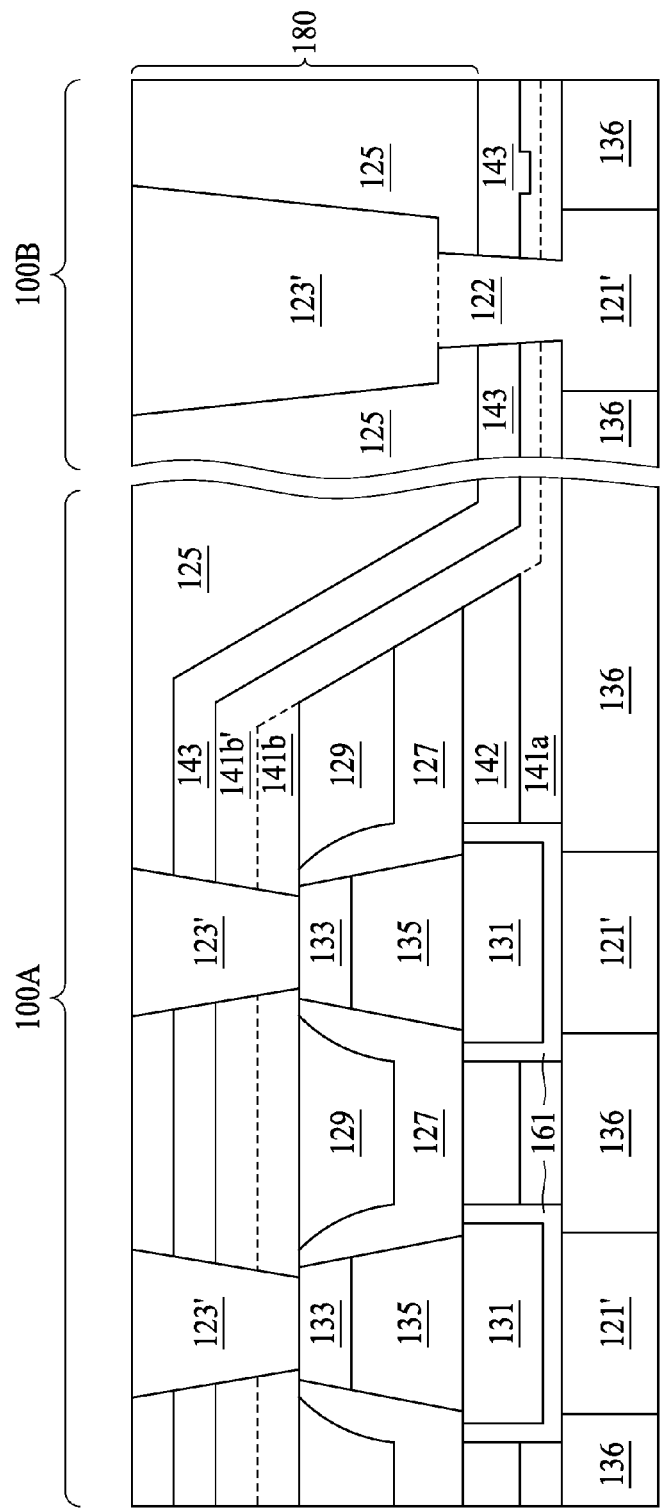

In FIG. 18 and FIG. 19, conductive metal fills the metal line trench/metal via trench (hereinafter "trenches") through, for example, a conventional Dual Damascene operation. The patterned trenches are filled with a conductive material by an electroplating operation, and excess portions of the conductive material are removed from the surface using a chemical mechanical polishing (CMP) operation, an etch operation, or a combination thereof. Details of electroplating the trenches are provided below. (N+1)$^{th}$ metal line 123' may be formed from tungsten (W), and more preferably from copper (Cu), including AlCu (collectively, Cu). In an embodiment, the (N+1)$^{th}$ metal lines 123' are formed using the Damascene operation. Firstly, trenches are etched through the low k dielectric layer by, for example, a plasma etch operation, such as an Inductively Coupled Plasma (ICP) etch. A dielectric liner (not shown) then may be deposited on the trenches sidewalls. In embodiments, the liner materials may include silicon oxide ($SiO_x$) or silicon nitride ($SiN_x$), which may be formed by a plasma deposition process, such as physical vapor deposition (PVD) or chemical vapor deposition (CVD) including plasma enhanced chemical vapor deposition (PECVD). Next, a seed layer of Cu is plated in the trenches. Note the seed layer of Cu may be plated over a top surface of the top electrode 133. Then a layer of copper is deposited in the trenches, followed by planarization of the copper layer, such as by chemical mechanical polishing (CMP), down to the top surface of a low k dielectric layer. The exposed copper surface and dielectric layer can be coplanar.

After the planarization operation removes the overburden of the conductive metal as illustrated in FIG. 19, an (N+1)$^{th}$ metal line 123' in both the MRAM cell region 100A and the logic region 100B, as well as an N$^{th}$ metal via 122 in the logic region 100B, are formed. Accordingly, the (N+1)$^{th}$ metal line 123' passes through the IMDs 125, the TEOS layer 143, the SiC layer 141b', and the SiC layer 141b. The SiC layer 141b' and the SiC layer 141b are the remnant portion used to prevent the top electrode 133 from being oxidized. The SiC layer 141b' and the SiC layer 141b surrounding the (N+1)$^{th}$ metal line 123' are the first portion 141b_1 of the semiconductor memory device 10 in FIG. 1.

In addition, in the logic region 100B, the N$^{th}$ metal via 122 passes through the IMDs 125, the TEOS layer 143, the SiC layer 141b', and the SiC layer 141a. The SiC layer 141b' and the SiC layer 141a are the remnant portion for preventing the exposure of the N$^{th}$ metal line 121'. The SiC layer 141b' and the SiC layer 141a surrounding the N$^{th}$ metal via 122 are the second portion 141b_2 of the semiconductor memory device 10 in FIG. 1.

Briefly, the present MRAM fabrication process provides two SiC recap processes to improve the electrical characteristic of a MRAM device. The first SiC recap process is carried out in FIG. 11, where the SiC layer 141b is disposed over the top surface of the top electrode 133 to protect the top electrode 133 from being oxidized. The first SiC recap process reduces the contact resistance of the top electrode 133 and consequently increases the signal to noise ratio (SNR) of the MRAM device. The second SiC recap process is carried out in FIG. 13, where the SiC layer 141b' is disposed over the SiC layer 141a in the logic region 100B to recap or repair the SiC layer 141a for preventing the exposure and oxidation of the N$^{th}$ metal line 121'. The second SiC recap process reduces the yield loss and reliability failure of the MRAM device.

Some embodiments of the present disclosure provide a method for fabricating a semiconductor memory device. The method comprises: exposing an electrode of a magnetoresitive cell; forming a first capping layer on the electrode; etching a portion of the first capping layer to form a first trench reaching the electrode; and forming a first metal line in the first trench to contact the electrode.

Some embodiments of the present disclosure provide a method for fabricating a semiconductor memory device. The method comprises: etching a first region of the semiconductor memory device to expose a first capping layer; forming a second capping layer on the first capping layer; etching a portion of the first capping layer and a portion of the second capping layer to form a first trench reaching a first metal line; and forming a second metal line in the first trench to contact the first metal line.

Some embodiments of the present disclosure provide a semiconductor memory device. The semiconductor memory device comprises a magnetoresitive structure, a first portion of capping layer, and a first metal line. The magnetoresitive structure has an electrode. The first portion of capping layer is disposed above the electrode. The first metal line is contacted the electrode. The first metal line is arranged to pass through the first portion of capping layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor memory device, the method comprising:
   depositing a bottom capping layer over a substrate in a first region and a second region of the substrate;
   etching an opening in the bottom capping layer in the first region and disposing a bottom electrode of a memory cell in the opening;
   forming a top electrode of the memory cell over the bottom electrode;

exposing a top surface of the top electrode of the memory cell;
forming a top capping layer on the top surface of the top electrode and interfacing the bottom capping layer in the second region of the substrate;
etching a portion of the top capping layer to form a first trench reaching the top surface of the top electrode; and
forming a first metal line in the first trench to contact the top electrode.

2. The method of claim 1, further comprising:
forming a tetraethyl orthosilicate (TEOS) layer on the top capping layer; and
wherein etching the portion of the top capping layer to form the first trench comprises:
etching the portion of the top capping layer and a portion of the TEOS layer to form the first trench.

3. The method of claim 2, wherein etching the portion of the top capping layer to form the first trench comprises:
etching the portion of the top capping layer and a portion of the TEOS layer to form the first trench.

4. The method of claim 2, further comprising:
etching a portion of the bottom capping layer, a portion of the top capping layer, and a portion of the TEOS layer to form a second trench reaching a second metal line in the second region of the substrate; and
forming a third metal line in the second trench to contact the second metal line.

5. The method of claim 1, wherein the second region is a logic region of the semiconductor memory device.

6. The method of claim 1, wherein the depositing the bottom capping layer and the forming the top capping layer each include depositing silicon carbide.

7. The method of claim 1, further comprising: forming a third capping layer over the top capping layer in the first region and the bottom capping layer in the second region of the substrate prior to forming the first metal line.

8. A method for fabricating a semiconductor memory device, the method comprising:
depositing a first capping layer in a first region and a second region of the semiconductor memory device;
forming a first memory cell in the first region of the semiconductor memory device over the first capping layer;
forming a second capping layer over the first capping layer in the first region and the second region of the semiconductor memory device;
etching a portion of the first capping layer and a portion of the second capping layer to form a first trench reaching a first metal line in the second region of the semiconductor memory device wherein the second capping layer is removed from the second region of the semiconductor memory device during the etching; and
after the etching, depositing a third capping layer over the first region and the second region of the semiconductor memory device, wherein the third capping layer interfaces a remaining portion of the first capping layer in the second region of the semiconductor memory device.

9. The method of claim 8, wherein the first region is a logic region of the semiconductor memory device, and the second region is a magnetoresitive cell region of the semiconductor memory device.

10. The method of claim 8, further comprising:
forming a TEOS layer on the third capping layer.

11. The method of claim 10, further comprising a second trench including etching the portion of the first capping layer, a portion of the third capping layer, and a portion of the TEOS layer to form the second trench exposing the first metal line.

12. The method of claim 8, further comprising:
forming a via in second region of the semiconductor memory device after depositing the third capping layer, wherein the via interfaces the first metal line, wherein the via extends through the remaining portion of the first capping layer and the third capping layer.

13. A method of fabricating a semiconductor device, comprising:
providing a first metal layer having a first line in a memory region and a second line in a logic region of a substrate;
depositing a barrier layer over the first line and the second line;
forming a first opening in the barrier layer in the memory region;
forming a bottom electrode in the first opening and connected to the first line;
disposing a magnetic tunnel junction (MTJ) structure on the bottom electrode;
forming a top electrode on the MTJ structure;
forming a first capping layer on an exposed top surface of the top electrode in the memory region and over the logic region of the substrate;
performing an etching back process on the logic region removing the first capping layer and exposing the barrier layer in the logic region; and
forming a second capping layer over and interfacing the first capping layer in the memory region and over and interfacing the barrier layer in the logic region.

14. The method of claim 13, further comprising:
after exposing the barrier layer and prior to forming the second capping layer, etching a second opening in the barrier layer in the logic region, wherein the second opening exposes the second line.

15. The method of claim 13, further comprising:
depositing at least one dielectric layer over the second capping layer; and
forming a via and a second conductive layer in the dielectric layer, wherein the via extends through the second capping layer to the second line.

16. The method of claim 13, further comprising:
forming a protection layer surrounding sidewalls of the MTJ structure and the top electrode.

17. The method of claim 16, further comprising:
performing a planarization process to provide the exposed top surface of the top electrode, wherein the performing the planarization process removes a portion of the protection layer.

18. The method of claim 13, further comprising:
forming a photoresist layer over the memory region while performing the etching back process.

19. The method of claim 13, wherein the performing the etching back process also removes the first capping layer from an inclined portion of the substrate between the MTJ and the logic region.

* * * * *